(12) United States Patent
Osaka et al.

(10) Patent No.: US 7,547,972 B2
(45) Date of Patent: Jun. 16, 2009

(54) LAMINATED STRUCTURE, VERY-LARGE-SCALE INTEGRATED CIRCUIT WIRING BOARD, AND METHOD OF FORMATION THEREOF

(75) Inventors: Tetsuya Osaka, Tokyo (JP); Masahiro Yoshino, Tokyo (JP)

(73) Assignee: Waseda University, Tokyo (JP)

( * ) Notice: Subject to any disclaimer, the term of this patent is extended or adjusted under 35 U.S.C. 154(b) by 141 days.

(21) Appl. No.: 11/529,535

(22) Filed: Sep. 29, 2006

(65) Prior Publication Data

US 2008/0079154 A1    Apr. 3, 2008

(51) Int. Cl.
*H01L 23/48* (2006.01)
*H01L 23/52* (2006.01)

(52) U.S. Cl. ................ 257/767; 257/751; 257/762; 257/764; 257/766; 257/E21.585; 438/653; 438/654

(58) Field of Classification Search ............. 257/751, 257/762, 764, 766, 767, E21.585; 438/653, 438/654
See application file for complete search history.

(56) References Cited

U.S. PATENT DOCUMENTS 5,830,563 A * 11/1998 Shimoto et al. ............. 428/209

(Continued)

FOREIGN PATENT DOCUMENTS

JP      2003-51538 A      2/2003

(Continued)

OTHER PUBLICATIONS

Shacham-Diamand et al., Integrated electroless metallization for ULSI, Depart. of Physical Electronics, Enginnering Faculty, Tel-Aviv Univ., Electrochimica Acta 44, pp. 3639-3649, 1999.

(Continued)

*Primary Examiner*—Nitin Parekh
(74) *Attorney, Agent, or Firm*—Birch, Stewart, Kolasch & Birch, LLP

(57) ABSTRACT

The laminated structure includes a substrate of low dielectric constant material of silicon compound and an electroless copper plating layer laminated thereon with a barrier layer. The barrier layer is interposed between the substrate and the copper layer, and the barrier layer is formed by electroless plating. And the laminated structure is characterized in that the barrier layer is formed on the substrate with a monomolecular layer of organosilane compound and a palladium catalyst which are interposed between the substrate and the barrier layer, the palladium catalyst modifies the terminal, adjacent to the barrier layer, of the monomolecular layer, and the barrier layer includes an electroless NiB plating layer which is disposed on the substrate side, and a electroless CoWP plating layer.

The present invention makes it possible to coat the low dielectric constant material of silicon compound in a simple all-wet process with a firmly adhering barrier layer and an electroless copper plating layer as the wiring layer. the advantage of requiring. Thus, the laminated structure formed in this way includes a substrate of low dielectric constant material of silicon compound, a barrier layer, and a copper layer as the wiring layer formed by electroless plating, which firmly adhere to one another. In addition, the laminated structure is suitable for the copper wiring in a ULSI, particularly the one which is to be formed in a narrower trench than conventional one.

13 Claims, 2 Drawing Sheets

U.S. PATENT DOCUMENTS

| | | | | |
|---|---|---|---|---|
| 6,153,935 | A * | 11/2000 | Edelstein et al. | 257/773 |
| 6,479,384 | B2 * | 11/2002 | Komai et al. | 438/687 |
| 7,341,946 | B2 * | 3/2008 | Kailasam et al. | 438/687 |
| 2004/0126548 | A1 | 7/2004 | Ueno et al. | |
| 2005/0110149 | A1 | 5/2005 | Osaka et al. | |
| 2006/0175708 | A1 * | 8/2006 | Ueno | 257/774 |
| 2006/0251800 | A1 * | 11/2006 | Weidman et al. | 427/99.5 |
| 2006/0252252 | A1 * | 11/2006 | Zhu et al. | 438/618 |

FOREIGN PATENT DOCUMENTS

JP    2005-142534 A    6/2005

OTHER PUBLICATIONS

Petrov et al., Electrochemical Study of the Electroless Deposition of Co(P) and Co(W, P) Alloys, Journal of The Electrochemical Society, 149 (4) C187-C194, 2002.

Yoshino et al., All-wet fabrication process for ULSI interconnect technologies, Electrochimica Acta 51, pp. 916-920, 2005.

* cited by examiner

LAMINATED STRUCTURE, VERY-LARGE-SCALE INTEGRATED CIRCUIT WIRING BOARD, AND METHOD OF FORMATION THEREOF

BACKGROUND OF THE INVENTION

1. Field of the Invention

The present invention relates to a laminated structure and a method for its fabrication. The laminated structure is suitable for copper interconnect structure to be formed on a substrate of low dielectric constant material based on a silicon compound. The present invention relates also to a Very-Large-Scale Integrated (ULSI) circuit wiring board and a method for its fabrication. The ULSI circuit wiring board is constructed such that the wiring layer is separated by an interlayer insulator of a low dielectric constant material based on a silicon compound, with a barrier layer interposed between them.

2. Description of the Related Art

The ever-increasing demand for ULSIs with a higher capacity and a lower production cost requires their interconnect structure to have a smaller wiring structure and to be fabricated in a simpler manner. For this reason, the wiring structure in a ULSI is fabricated mainly by the dual-damascene process at the present time. Fabrication of the interconnect structure in a ULSI by the dual-damascene process invariably needs a barrier layer interposed between the wiring layer and the interlayer insulator. This barrier layer prevents copper from diffusing into the interlayer insulator. Without this barrier layer, copper that forms the wiring layer diffuses into the interlayer insulator to bring about insulation failure.

It has been common practice to form the barrier layer from TaN or TiN principally by sputtering. The barrier layer of TaN or TiN needs to be coated with a copper seed layer as a conducting layer because it is poor in conductivity, if the wiring layer is to be formed thereon by electric copper plating.

Fabricating the barrier layer and conducting layer by sputtering, which is a dry process, offsets the advantage of the dual-damascene process, which is a wet process suitable for easy practice and cost reduction.

A possible measure against this situation is to form the barrier layer by electroless plating, which is a wet process. A method for forming the barrier layer by electroless plating is reported in Electrochimica Acta, 44, 1999, pp. 3639-3649. This method involves a step of forming a cobalt layer by sputtering on the surface of the interlayer insulator. The cobalt layer functions as a catalyst layer that helps form the barrier layer of CoWP by electroless plating. The catalyst layer to be formed by sputtering needs a certain thickness to ensure good adhesion between the barrier layer and the interlayer insulator and to ensure uniformity in the barrier layer.

The foregoing method, however, will not reduce the interconnect size of ULSIs beyond the one (equal to or smaller than 100 nm) expected by the industry in near future. Moreover, the foregoing method needs many steps to fabricate the wiring layer and involves processes differing in phase (dry process for sputtering and CVD and wet process for plating). Therefore, it is complex and undesirable costwise. Another disadvantage is that the dry process for sputtering and CVD cannot make a uniform layer as trenches in the wiring layer become narrower than before.

Under the circumstances mentioned above, there has arisen a need for a new method of forming both the barrier layer and the wiring layer only by electroless plating, which is a wet process.

SUMMARY OF THE INVENTION

In the case where both the barrier layer and the wiring layer are formed by electroless plating which is a wet process, the interlayer insulator should be given a catalyst also by a wet process. The resulting catalyst should effectively work when the barrier layer is formed by electroless plating. In addition, the resulting barrier layer should fulfill its function (prevention of copper diffusion from the copper wiring layer) and also remain on the interlayer insulator while the wiring layer is being formed by electroless plating in the plating bath and after the wiring layer has been formed by electroless plating.

Since the interconnect structure in a ULSI needs a copper wiring layer free of voids and any other defects in its extremely narrow trench, the electroless plating, which is able to be free of voids and the defects, should be carried out in such a way as to prevent peeling from the interlayer insulator.

The present invention was completed in view of the foregoing. It is an object of the present invention to provide:

a laminated structure includes a low dielectric constant substrate of silicon compound, a barrier layer, and a wiring layer which are firmly bonding to one another, a ULSI interconnect structure based on the laminated structure, and a method for efficiently fabricating them only by wet processes.

The laminated structure is suitable for the copper wiring of the ULSI interconnect structure in which the wiring layer is separated from the interlayer insulator of a low dielectric constant material of silicon compound, with a barrier layer interposed between them.

The first aspect of the present invention covers a laminated structure suitable for the copper wiring of the ULSI interconnect structure to be formed on a substrate of low dielectric constant material of silicon compound. The laminated structure includes a substrate of low dielectric constant material of silicon compound and an electroless copper plating layer laminated thereon with a barrier layer. The barrier layer is interposed between the substrate and the copper layer, and the barrier layer is formed by electroless plating. And the laminated structure is characterized in that the barrier layer is formed on the substrate with a monomolecular layer of organosilane compound and a palladium catalyst which are interposed between the substrate and the barrier layer, the palladium catalyst modifies the terminal, adjacent to the barrier layer, of the monomolecular layer, and the barrier layer includes an electroless NiB plating layer which is disposed on the substrate side, and a electroless CoWP plating layer.

The laminated structure may be formed by a method which includes steps of:

coating a substrate of low dielectric constant material of silicon compound with a monomolecular layer of organosilane compound by contacting the surface of the substrate with the organosilane compound, contacting the monomolecular layer with an aqueous solution containing a palladium compound for modifying the monomolecular layer by a catalyst, forming an electroless NiB plating layer by electroless NiB plating on the monomolecular layer which is modified by the catalyst, forming an electroless CoWP plating layer by electroless CoWP plating on the electroless NiB plating layer, and forming an electroless copper layer by electroless copper plating on the electroless CoWP plating layer.

The laminated structure mentioned above includes the barrier layer, copper layer, monomolecular layer of organosilane compound, and catalyst, which are all formed by a wet process. In addition, the substrate, the barrier layer and the copper layer keep firm adhesion one another while the copper layer is being formed (in electroless plating bath) and after it has been formed by electroless plating.

As mentioned above, the monomolecular layer of organosilane compound is modified by a palladium catalyst. The palladium catalyst in a very small amount helps form the NiB layer and the CoWP layer sequentially by electroless plating, and the barrier layer can be efficiently formed on the catalytically activated monomolecular layer only by a wet process. And the resulting barrier layer firmly adheres to the substrate of low dielectric constant material of silicon compound.

The copper layer on the barrier layer may be in direct contact with the CoWP layer, so that they firmly adhere to each other.

The laminated structure mentioned above is applicable to the ULSI circuit wiring board. Thus, the second aspect of the present invention covers a ULSI circuit wiring board includes a wiring layer which is separated by an interlayer insulator consisting of a low dielectric constant material of silicon compound and a barrier layer which is interposed between the wiring layer and the interlayer insulator.

The ULSI circuit wiring board further includes a wiring layer of electroless copper plating layer which is laminated on the interlayer insulator consisting of a low dielectric constant material of silicon compound and a barrier layer which is interposed between the wiring layer and the interlayer insulator. And the ULSI circuit wiring board is characterized in that the barrier layer is formed on the interlayer insulator with a monomolecular layer of organosilane compound and a palladium catalyst which are interposed between the interlayer insulator and the barrier layer, the palladium catalyst modifies the terminal, adjacent to the barrier layer, of the monomolecular layer, and the barrier layer includes an electroless NiB plating layer which is disposed on the substrate side, and a electroless CoWP plating layer.

The ULSI circuit wiring board may be formed by the method which includes steps of:

coating an interlayer insulator of low dielectric constant material of silicon compound with a monomolecular layer of organosilane compound by contacting the surface of the interlayer insulator with the organosilane compound, contacting the monomolecular layer with an aqueous solution containing a palladium compound for modifying the monomolecular layer by a catalyst, forming an electroless NiB plating layer by electroless NiB plating on the monomolecular layer which is modified by the catalyst, forming an electroless CoWP plating layer by electroless CoWP plating on the electroless NiB plating layer, and forming an electroless copper layer by electroless copper plating on the electroless CoWP plating layer.

The ULSI circuit wiring board should have a wiring layer which is formed in a trench having a width of 32 to 500 nm. This requirement is met by the above-mentioned method which permits the wiring layer to be formed in a narrow trench.

The present invention makes it possible to coat the low dielectric constant material of silicon compound in a simple all-wet process with a firmly adhering barrier layer and an electroless copper plating layer as the wiring layer. the advantage of requiring. Thus, the laminated structure formed in this way includes a substrate of low dielectric constant material of silicon compound, a barrier layer, and a copper layer as the wiring layer formed by electroless plating, which firmly adhere to one another. In addition, the laminated structure is suitable for the copper wiring in a ULSI, particularly the one which is to be formed in a narrower trench than conventional one.

DESCRIPTION OF THE PREFERRED EMBODIMENTS

The invention will be described below in more detail with reference to its preferred embodiments.

The laminated structure according to the present invention includes a substrate of low dielectric constant (low-k) material of silicon compound, a barrier layer formed by electroless plating, and a copper layer formed by electroless plating, which are placed one over another. The barrier layer includes an NiB layer and a CoWP layer, both formed by electroless plating (which are arranged sequentially upward from the substrate). Between the substrate and the barrier layer is a monomolecular layer of organosilane compound, which carries a palladium catalyst which modifies the free terminals of the molecules constituting the monomolecular layer.

Figure 1:
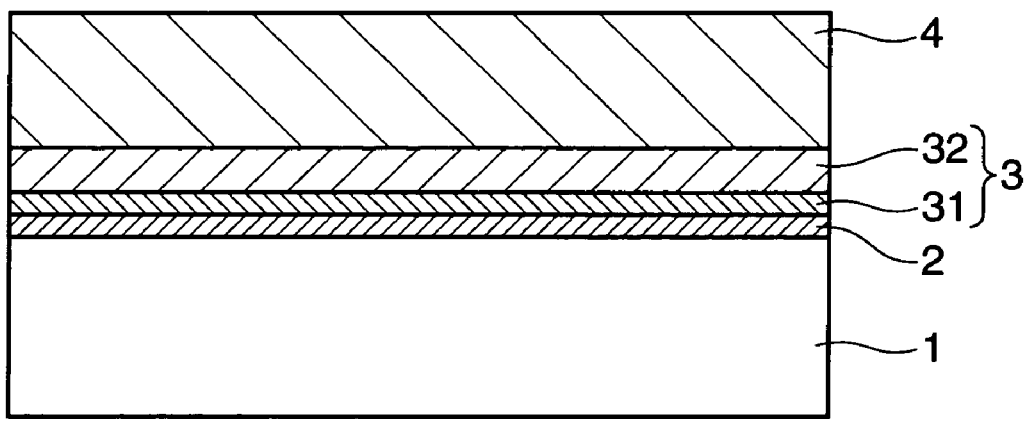
FIG. 1, is a schematic diagram showing one example of the laminated structure according to the present invention.

FIG. 1 shows a typical example of the laminated structure, which includes a substrate 1 of low dielectric constant material of silicon compound, a monomolecular layer 2 of organosilane compound (which carries a palladium catalyst thereon), a barrier layer 3, and a copper layer 4 formed by electroless plating, which are placed one over another upward. The barrier layer 3 includes an NiB layer 31 formed by electroless plating and a CoWP layer 32 formed by electroless plating, which are placed on top of the other.

The low dielectric constant material of silicon compound, which constitutes the substrate, includes silicon oxide ($SiO_2$), silicon oxide carbide (SiOC), silicon oxide fluoride (SiOF), silicon carbide (SiC), and hydrogen silsesquioxane (HSQ). It may be a material which contains Si and has a dielectric constant (k) of about two to four. It also includes the one which is formed by CVD process or SOG (spin on glass) process on any substrate (such as Si) excluding the low dielectric constant material of silicon compound.

The organosilane compound for the monomolecular layer on the substrate includes, for example, N-(2-aminoethyl)-3-aminopropyltrimethoxysilane, 3-aminopropyltrimethoxysilane, 3-aminopropyltriethoxysilane, 2-(trimethoxysilyl)ethyl-2-pyridine, and (aminoethyl)-phenetyltrimethoxysilane, (all of which have an alkoxyl group and an amino group), and γ-glycidylpropyltrimethoxysilane, (which has an alkoxyl group and an epoxy group). Of these examples, organosilane compounds having an alkoxyl group and an amino group are desirable from the standpoint of adhesion to the substrate and compatibility with the catalyst. An organosilane compound having a terminal thiol group is also desirable because of its good compatibility with a metal catalyst.

The monomolecular layer of the organosilane compound may be formed from a gas phase or a solution. The solution method is desirable because of its convenience and good productivity. The solution method includes dissolving an organosilane compound in a solvent and dipping the substrate in the resulting solution. The solvent includes alcohols (such as methanol and ethanol) and hydrocarbons (such as toluene). Ethanol is particularly preferable.

The solution of an organosilane compound varies in concentration depending on the duration of dipping of the substrate of low dielectric constant material of silicon compound. It should preferably have a concentration of 0.2 to 2 vol %, particularly about 1 vol %. It addition, it should preferably be used at 20 to 90° C., more preferably 40 to 70° C., particularly 50 to 60° C. Incidentally, the duration of dipping varies depending on the solution concentration and temperature; it is usually 1 minute to 10 hours, preferably 5 minutes to 2 hours.

Dipping in the solution of organosilane compound is followed by washing to remove excess organosilane compound. Washing may be accomplished by contacting or dipping in alcohols such as ethanol or an alcohol-water mixture (with optional ultrasonic treatment). Thus the monomolecular layer of organosilane compound is formed on the substrate of low dielectric constant material of silicon compound.

According to the present invention, the substrate carrying monomolecular layer is catalyzed by the solution containing palladium compound in the next step. As mentioned above, the substrate of low dielectric constant material of silicon compound is treated with an organosilane compound, particularly the one which has an alkoxyl group and an amino group, to form the self-organizing monomolecular layer which chemically bonds to the surface of the substrate. Subsequently, the substrate carrying the monomolecular layer is dipped in an aqueous solution containing a palladium salt, so that palladium is captured by the amino group. The captured palladium functions as a catalyst. In other words, when the monomolecular layer of organosilane compound formed on the substrate of low dielectric constant material of silicon compound is dipped in an aqueous solution containing a palladium salt, the free terminals of the molecules constituting the monomolecular layer are modified by palladium. The resulting palladium catalyst helps form the barrier layer. The organosilane compound having a terminal thiol group is also catalyzed because palladium is firmly captured by the thiol group.

Here, the aqueous solution containing a palladium compound for catalyst deposition should preferably be an acidic one containing a water-soluble palladium compound such as $PdCl_2$ and $Na_2PdCl_4$. The content of the palladium compound should preferably be 0.01 to 0.5 g/L, preferably 0.04 to 0.1 g/L, and more preferably 0.04 to 0.05 g/L in terms of palladium. The aqueous solution for catalyst deposition may optionally contain a buffer such as 2-morpholinoethanesulfonic acid and/or a stabilizer such as NaCl. In addition, it should preferably have an adequate pH value depending on the kind and concentration of the buffer and stabilizer contained therein. With a buffer, it should preferably have pH 2 to 6, preferably pH 4 to 6, more preferably pH 5 or so (enough to prevent precipitation). Without a buffer, it should preferably have pH 1.5 to 3, preferably pH 2 or so.

The aqueous solution may be used under greatly different conditions for catalyst deposition depending on its composition. The dipping temperature is 10 to 40° C., preferably 20 to 30° C., more preferably 20 to 25° C. (or room temperature). The duration of dipping is 5 seconds to 60 minutes, preferably 10 seconds to 30 minutes. The step of catalyst deposition may be followed by acceleration treatment to convert the palladium compound into stable metallic palladium. The acceleration treatment may be accomplished with an aqueous solution of dimethylamineborane.

Next, the barrier layer is formed by electroless plating on the substrate of low dielectric constant material of silicon compound, with the monomolecular layer of organosilane compound and the palladium catalyst (which modifies the free terminals of the molecules constituting the monomolecular layer) interposed between them.

According to the present invention, the barrier layer includes an NiB layer and a CoWP layer, both formed by electroless plating, the NiB layer facing the substrate of low dielectric constant material of silicon compound. The NiB layer is formed first by electroless plating and then the CoWP layer is formed thereon by electroless plating, the NiB layer serving as a nucleus for electroless plating of CoWP layer. This is because the electroless plating for the NiB layer is effectively catalyzed by a small amount of palladium catalyst that modifies the free terminals of the molecules constituting the monomolecular layer of organosilane compound. Thus the barrier layer of dual layer structure can be formed only by electroless plating which is a wet process. In addition, it has good adhesion to the substrate of low dielectric constant material of silicon compound.

The NiB layer should preferably include boron (B) in an amount of 3 to 15 wt %, particularly 4 to 10 wt %, and nickel (Ni) for the remainder. It is usually in amorphous form.

The NiB layer may be formed by using any known electroless plating bath which contains the following ingredients.
  a water-soluble nickel salt, such as nickel sulfate, 0.05 to 0.3 mol/L, preferably 0.05 to 0.15 mol/L.
  reducing agent, such as dimethylamineborane (DMAB), 0.01 to 0.2 mol/L, preferably 0.025 to 0.05 mol/L.
  optional carboxylic acid or its salt as a complexing agent, such as citric acid, tartaric acid, succinic acid, malonic acid, malic acid and gluconic acid, and its salts, 0.1 to 0.3 mol/L, preferably 0.15 to 0.2 mol/L.
  pH adjustor, such as NaOH, KOH, and tetramethylammonium hydroxide (TMAH), to adjust the bath to pH 6 to 11, preferably pH 8.5 to 9.5.
  buffer and/or stabilizer (optional).

Electroless plating for the NiB layer may be accomplished under ordinary conditions. The bath temperature may be 60 to 90° C., preferably 70 to 80° C., and the duration of plating may be 5 to 30 seconds, preferably 10 to 15 seconds. The thickness of the NiB layer should preferably be 0.5 to 10 nm, preferably 0.5 to 2 nm.

The CoWP layer should preferably include tungsten (W) in an amount of 0.1 to 5 wt %, particularly 1 to 2 wt %, phosphorus (P) in an amount of 0.1 to 5 wt %, particularly 0.5 to 1.5 wt %, and cobalt (Co) for the remainder.

The CoWP layer may be formed by using any known electroless plating bath which contains the following ingredients.
  water-soluble cobalt salt, such as cobalt sulfate, 0.01 to 0.15 mol/L, preferably 0.05 to 0.1 mol/L.
  water-soluble tungsten salt, such as $Na_2WO_4.2H_2O$ and $H_3[P(W_3O_{10})_4]$, 0.001 to 0.1 mol/L, preferably 0.005 to 0.05 mol/L.
  reducing agent, such as hypophosphorous acid (e.g., sodium hypophosphite) and its salt, 0.05 to 0.3 mol/L, preferably 0.15 to 0.2 mol/L.
  optional carboxylic acid or its salt as a complexing agent, such as citric acid, tartaric acid, succinic acid, malonic acid, malic acid and gluconic acid, and its salts, 0.10 to 1 mol/L, preferably 0.3 to 0.6 mol/L.
  pH adjustor, such as NaOH, KOH, and tetramethylammonium hydroxide (TMAH), to adjust the bath to pH 6 to 10, preferably pH 8 to 9.5.
  buffer and/or stabilizer (optional).

Electroless plating for the CoWP layer may be accomplished under ordinary conditions. The bath temperature may be 50 to 90° C., preferably 70 to 80° C., and the duration of plating may be 15 to 600 seconds, preferably 60 to 120 seconds. The thickness of the CoWP layer should preferably be 1 to 50 nm, preferably 2 to 5 nm.

Finally, the copper layer is formed by electroless plating on the substrate of low dielectric constant material of silicon compound, with the above-mentioned barrier layer interposed between them.

According to the present invention, the copper layer is formed by electroless plating directly on the barrier layer. Firstly, a copper nucleus is precipitated by substitution reaction on the CoWP layer (as a constituent of the barrier layer) which has been formed by electroless plating as mentioned above. Next, the electroless copper plating occurs on the copper nucleus. In other words, the electroless plating for the copper layer follows the electroless plating for the barrier layer. Thus the laminated structure can be formed only by a wet process.

The copper layer may be formed by using any known electroless plating bath containing a reducing agent such as formalin, hypophosphorous acid, dimethylamineborane, and $NaBH_4$. The electroless plating may be accomplished under ordinary conditions.

The laminated structure according to the present invention is useful to constitute the copper wiring layer of ULSI circuit wiring board which is separated by an interlayer insulator of low dielectric constant material of silicon compound. The ULSI circuit wiring board to which the laminated structure is applied may include the following embodiment.

A ULSI circuit wiring board includes a wiring layer which is separated by an interlayer insulator consisting of a low dielectric constant material of silicon compound and a barrier layer which is interposed between the wiring layer and the interlayer insulator.

The ULSI circuit wiring board further includes a wiring layer of electroless copper plating layer which is laminated on the interlayer insulator consisting of a low dielectric constant material of silicon compound and a barrier layer which is interposed between the wiring layer and the interlayer insulator.

The barrier layer is formed on the interlayer insulator with a monomolecular layer of organosilane compound and a palladium catalyst which are interposed between the interlayer insulator and the barrier layer.

The palladium catalyst modifies the terminal, adjacent to the barrier layer, of the monomolecular layer.

The barrier layer includes an electroless NiB plating layer which is disposed on the substrate side, and a electroless CoWP plating layer.

Figure 2:
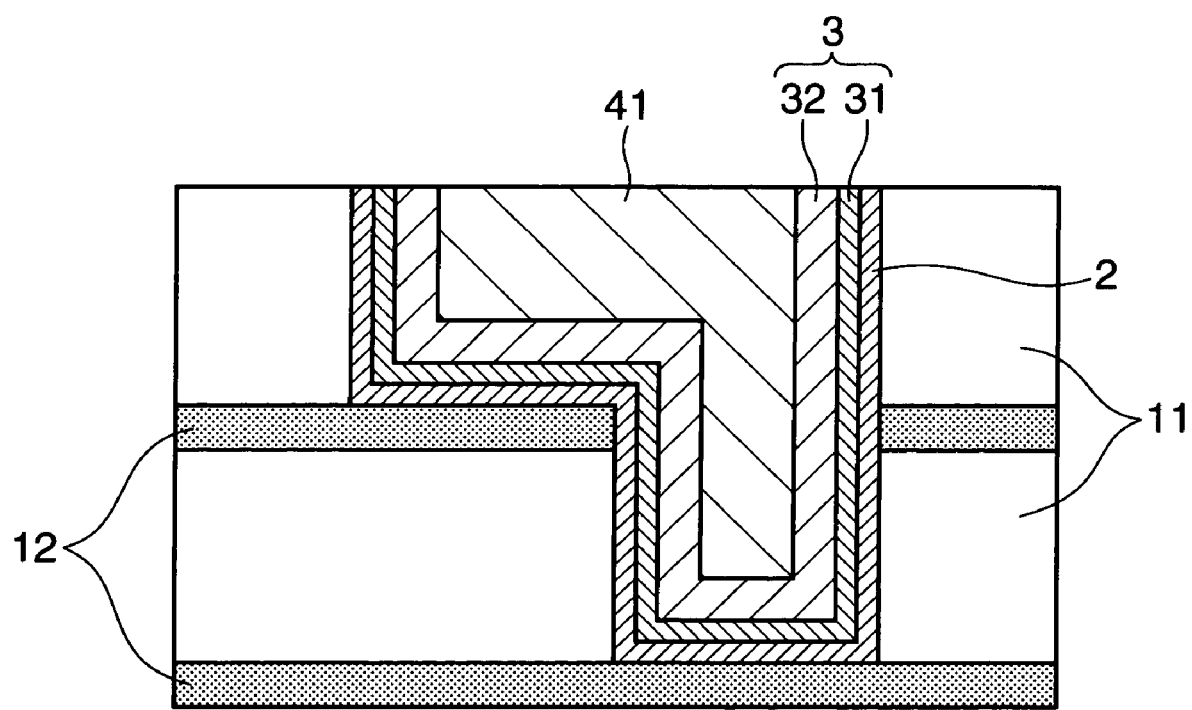
FIG. 2 is a schematic diagram showing one example of the ULSI circuit wiring board according to the present invention.

FIG. 2 shows a typical example the ULSI circuit wiring board constructed as mentioned above. This ULSI circuit wiring board includes an interlayer insulator 11 of low dielectric constant material of silicon compound, a monomolecular layer of organosilane compound 2 which carries a palladium catalyst, a barrier layer 3 including an NiB layer 31 and a CoWP layer 32 both formed by electroless plating, and a copper wiring layer 41 formed by electroless plating, which are placed one over another. In FIG. 2, there are also shown etch stopping layers 12. The etch stopping layers 12 may partly cover the wall surface of the trench in which the wiring layer 41 is formed and which is surrounded by the interlayer insulator (of low dielectric constant material of silicon compound), as shown in FIG. 2. In this case, the etch stopping layers should preferably be formed from a material of silicon compound, such as silicon nitride (SiN), which permits the monomolecular layer of organosilane compound to be formed thereon.

In the ULSI circuit wiring board according to the present invention, the interlayer insulator formed from a low dielectric constant material of silicon compound corresponds to the substrate formed from a low dielectric constant material of silicon compound in the laminated structure mentioned above, and it is also possible to constitute the monomolecular layer of organosilane compound which carries the palladium catalyst, the barrier layer including an NiB layer and a CoWP layer both formed by electroless plating, and the copper wiring layer formed by electroless plating in the same way as in the laminated structure mentioned above. They can be formed in the same way as in the laminated structure mentioned above.

The ULSI circuit wiring board should preferably have the wiring layer formed in a trench whose width is 32 to 500 nm, preferably 32 to 300 nm, particularly 32 to 100 nm, and whose aspect ratio (depth/width) is 1 to 20, particularly 3 to 5. The above-mentioned method according to the present invention is particularly suitable to form the ULSI circuit wiring board having the wiring layer in a narrow trench.

The object of forming a wiring layer in a narrow trench of the ULSI circuit wiring board may be achieved by using an electroless plating bath containing a water-soluble copper salt, reducing agent, complexing agent, precipitation suppressor, and precipitation accelerator. The reducing agent may be glyoxylic acid. The precipitation suppressor may be polyethylene glycol, polypropylene glycol, or ethylene glycol-propylene glycol copolymer. This electroless plating bath should preferably be free of Na ions.

Incidentally, the method of the present invention may be modified such that the step of forming the barrier layer is followed by heat treatment at 300 to 45° C., particularly 300 to 350° C. for 10 to 30 minutes, particularly 25 to 30 minutes. This heat treatment enhances adhesion; however, it is not essential for good adhesion because fabrication of the ULSI circuit wiring board always involves heating.

EXAMPLES

The invention will be described in more detail with reference to the following Examples, which are not intended to restrict the scope thereof.

Example 1

A silicon substrate (with a 30-nm thick $SiO_2$ coating) was cleaned by SPM treatment [$H_2SO_4$:$H_2O_2$=4:1 by volume] at 80° C. for 10 minutes. The cleaned silicon substrate was dipped in a solution of N-(2-aminoethyl)-3-aminopropyl-trimethoxysilane in ethanol (1/99 by volume) at 50° C. for four hours, for coating with a monomolecular layer of organosilane compound. This step was followed by ultrasonic cleaning in ethanol for removal of excess organosilane compound.

Next, the silicon substrate was dipped in an aqueous solution specified below at room temperature for ten to 600 seconds so as to modify the monomolecular layer into a catalyst. After this step, the silicon substrate was washed with ultrapure water and then held in ultrapure water.

<Aqueous Solution for Catalyst Deposition>
 $PdCl_2$: 0.0005 mol/L
 HCl: 0.016 mol/L
 pH: 1.5 to 2.0

Subsequently, the silicon substrate was dipped in an NiB electroless plating bath specified below at 70° C. for 30 seconds so that the monomolecular layer of organosilane compound (which had been modified in the preceding step) was coated with an NiB layer (about 10 nm thick).

<NiB Electroless Plating Bath>
 Citric acid: 0.2 mol/L
 $NiSO_4$: 0.1 mol/L

Dimethylamineborane (DMAB): 0.05 mol/L
pH: 9.0 (adjusted with tetramethylammonium hydroxide (TMAH))

The silicon substrate was dipped again in a CoWP electroless plating bath specified below at 80° C. for 2 minutes so that the NiB layer was coated with a CoWP layer (about 30 nm thick). The thus formed NiB layer and CoWP layer constitute the barrier layer.

<CoWP electroless plating bath>
    $CoSO_4.7H_2O$: 0.08 mol/L
    $Na_3C_5H_5O_7.H_2O$: 0.50 mol/L
    $H_3BO_3$: 0.50 mol/L
    $NaH_2PO_2.2H_2O$: 0.17 mol/L
    $Na_2WO_4.2H_2O$: 0.03 mol/L
    $H_3[P(W_3O_{10})_4]$: 0.006 mol/L
    pH: 8.8 to 9.0 (adjusted with KOH)

The silicon substrate having the barrier layer formed thereon was dipped in a copper electroless plating bath specified below at 70° C. for 5 minutes so that the barrier layer was coated with a copper layer (200 nm thick).

<Copper Electroless Plating Bath>
    $CuSO_4.5H_2O$: 0.045 mol/L
    Ethylenediaminetetraacetic acid (EDTA): 0.09 mol/L
    Glyoxylic acid: 0.17 mol/L
    2,2'-bipyridyl: 25 ppm
    Polyethylene glycol (PEG) 1000 (ave. M.W.): 750 ppm
    pH: 12.5 (adjusted with TMAH)

The resulting laminated structure was tested for peel strength by cross-cut test, in which the sample was scored in a checkerboard pattern at intervals of 1 mm and the scored pattern was pulled up by a piece of conducting tape adhered thereto. (Conducting tape, spec. 1-7769-01, from TWC Taiyo Wire Cloth Co., Ltd.) This test proved good adhesion without peeling in any layer.

Comparative Example 1

The same procedure as in Example 1 was repeated to coat the substrate with the monomolecular layer of organosilane compound, whose surface was subsequently modified into a catalyst. The silicon substrate was dipped in an NiB electroless plating bath (as specified in Example 1) at 70° C. for 3 minutes so that the modified monomolecular layer of organosilane compound was coated with an NiB layer (about 50 nm thick), which functions as the barrier layer.

The silicon substrate having the barrier layer formed thereon was dipped in the copper electroless plating bath (as specified in Example 1) at 70° C. The barrier layer peeled off within 10 seconds, preventing the copper layer from being formed by electroless plating.

Comparative Example 2

The same procedure as in Example 1 was repeated to coat the substrate with the monomolecular layer of organosilane compound, whose surface was subsequently modified into a catalyst. The silicon substrate was dipped in an NiB electroless plating bath (as defined in Example 1) at 70° C. for 30 seconds so that the modified monomolecular layer of organosilane compound was coated with an NiB layer (about 10 nm thick). Then, the substrate was dipped in a CoWB electroless plating bath (specified below) at 70° C. for 3 minutes so that the NiB layer was coated with a CoWB layer (about 50 nm thick). The thus formed NiB layer and CoWB layer constitute the barrier layer.

<CoWB electroless plating bath>
    $CoCl_2.6H_2O$: 0.1 mol/L
    $Na_3C_5H_5O_7.H_2O$: 0.35 mol/L
    DMAB: 0.08 mol/L
    $Na_2WO_4$: 0.035 mol/L
    pH: 9.5 (adjusted with KOH)

The silicon substrate having the barrier layer formed thereon was dipped in the copper electroless plating bath (as specified in Example 1) at 70√C. The barrier layer peeled off within 10 seconds, preventing the copper layer from being formed by electroless plating.

Comparative Example 3

The same procedure as in Example 1 was repeated to coat the substrate with the monomolecular layer of organosilane compound, whose surface was subsequently modified into a catalyst. The silicon substrate was dipped in an NiP electroless plating bath (specified below) at 90° C. for 1 minute so that the modified monomolecular layer of organosilane compound was coated with an NiP layer (about 10 nm thick), which functions as the barrier layer.

<NiP electroless plating bath>
    $NiSO_4.6H_2O$: 0.075 mol/L
    $NaH_2PO_2.H_2O$: 0.10 mol/L
    $Na_3C_5H_5O_7.H_2O$: 0.40 mol/L
    pH: 9.0 (adjusted with NaOH)

The silicon substrate having the barrier layer formed thereon was dipped in the copper electroless plating bath (as specified in Example 1) at 70° C. The barrier layer peeled off within ten seconds, preventing the copper layer from being formed by electroless plating.

Comparative Example 4

The same procedure as in Example 1 was repeated to coat the substrate with the monomolecular layer of organosilane compound, whose surface was subsequently modified into a catalyst. The silicon substrate was dipped in an NiMoB electroless plating bath (specified below) at 70° C. for 5 minutes so that the modified monomolecular layer of organosilane compound was coated with an NiMoB layer (about 20 nm thick), which functions as the barrier layer.

<NiMoB electroless plating bath>
    Citric acid: 0.2 mol/L
    $MoO_3$: 0.01 mol/L
    $NiSO_4$: 0.1 mol/L
    DMAB: 0.05 mol/L
    pH: 9.0 (adjusted with TMAH)

The silicon substrate having the barrier layer formed thereon was dipped in the copper electroless plating bath (as specified in Example 1) at 70° C. The barrier layer peeled off within ten seconds, preventing the copper layer from being formed by electroless plating.

Comparative Example 5

The same procedure as in Example 1 was repeated to coat the substrate with the monomolecular layer of organosilane compound, whose surface was subsequently modified into a catalyst. The silicon substrate was dipped in a CoWP electroless plating bath (as specified in Example 1) at 70° C. for 5 minutes; however, this step did not form the CoWP layer by electroless plating, failing to form the barrier layer.

Comparative Example 6

The same procedure as in Example 1 was repeated to coat the substrate with the monomolecular layer of organosilane compound, whose surface was subsequently modified into a catalyst. The silicon substrate was dipped in a CoWB electroless plating bath (as specified in Comparative Example 2) at 70° C. for 5 minutes; however, this step did not form the CoWB layer by electroless plating, failing to form the barrier layer.

Example 2

The same procedure as in Example 1 was repeated to form the monomolecular layer on an SiO₂ substrate having a trench pattern formed thereon (100 nm wide, with an aspect ratio (depth/width) of three). The monomolecular layer had its surface modified into a catalyst. Then, the substrate was dipped in an NiB electroless plating bath (as specified in Example 1) at 70° C. for 15 seconds so that the modified monomolecular layer of organosilane compound was coated with an NiB layer (about 10 nm thick). The substrate was dipped again in a CoWP electroless plating bath (as specified in Example 1) at 90° C. for 2 minutes so that the NiB layer was coated with a CoWP layer (about 20 nm thick). The thus formed NiB layer and CoWP constitute the barrier layer.

Figure 3:
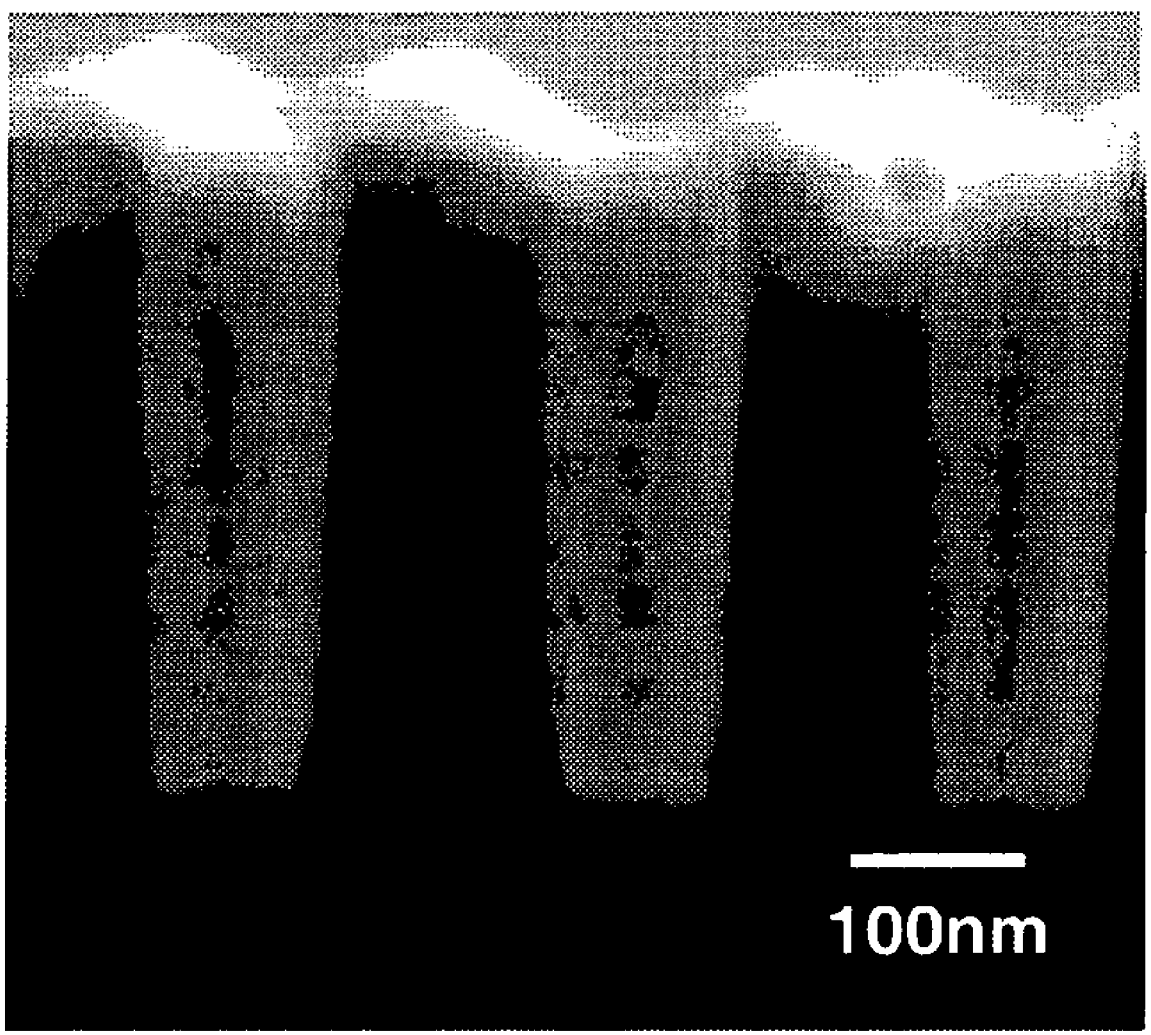
FIG. 3 is an SEM image showing the cross section of the copper-filled trench in Example 2.

The substrate having the barrier layer formed thereon was dipped in a copper electroless plating bath (as specified in Example 1) at 70° C. for 3 minutes so that the barrier layer was coated with a copper layer which fills the trench. In this way the wiring layer was formed. FIG. 3 is a scanning electron microscope (SEM) image showing the cross section of the copper-filled trench. This example demonstrates that the laminated structure including the copper layer, CoWP layer, NiB layer, Pd, and monomolecular layer of organosilane compound serves as the copper wiring layer satisfactorily.

The invention claimed is:

1. A laminated structure comprising a substrate of a silicon compound and an electroless copper plating layer laminated thereon with a barrier layer, the barrier layer being interposed between the substrate and the copper layer, and the barrier layer being formed by electroless plating, wherein
the barrier layer is formed on the substrate with a monomolecular layer of organosilane compound and a palladium catalyst which are interposed between the substrate and the baffler layer,
the palladium catalyst modifies the terminal, adjacent to the baffler layer, of the monomolecular layer, and
the baffler layer includes an electroless NiB plating layer which is disposed on the substrate side, and a electroless CoWP plating layer.

2. The method for forming the laminated structure of claim 1 comprising steps of:
coating a substrate of low dielectric constant material of silicon compound with a monomolecular layer of organosilane compound by contacting the surface of the substrate with the organosilane compound,
contacting the monomolecular layer with an aqueous solution containing a palladium compound for modifying the monomolecular layer by a catalyst,
forming an electroless NiB plating layer by electroless NiB plating on the monomolecular layer which is modified by the catalyst,
forming an electroless CoWP plating layer by electroless CoWP plating on the electroless NiB plating layer, and
forming an electroless copper layer by electroless copper plating on the electroless CoWP plating layer.

3. The laminated structure of claim 1, wherein the silicon compound comprises at least one compound selected from the group consisting of silicon oxide ($SiO_2$), silicon oxide carbide (SiOC), silicon oxide fluoride (SiOF), silicon carbide (SiC) and hydrogen silsesquioxane (HSQ).

4. The laminated structure of claim 1, wherein the silicon compound has a dielectric constant k of two to four.

5. The laminated structure of claim 1, wherein the electroless NiB plating layer has a thickness of 0.5 to 10 nm.

6. The laminated structure of claim 1, wherein the electroless CoWP plating layer has a thickness of 1 to 50 nm.

7. A ULSI circuit wiring board comprising a wiring layer which is separated by an interlayer insulator consisting of a silicon compound and a barrier layer which is interposed between the wiring layer and the interlayer insulator, and
further comprising a wiring layer of electroless copper plating layer which is laminated on the interlayer insulator consisting of a silicon compound and a barrier layer which is interposed between the wiring layer and the interlayer insulator, wherein
the barrier layer is formed on the interlayer insulator with a monomolecular layer of organosilane compound and a palladium catalyst which are interposed between the interlayer insulator and the barrier layer,
the palladium catalyst modifies the terminal, adjacent to the barrier layer, of the monomolecular layer, and
the barrier layer includes an electroless NiB plating layer which is disposed on the substrate side, and a electroless CoWP plating layer.

8. The ULSI circuit wiring board of claim 7, wherein the wiring layer is formed in a trench having a width of 32 to 500 nm.

9. The method for forming the ULSI circuit wiring board of claim 7, comprising steps of
coating an interlayer insulator of low dielectric constant material of silicon compound with a monomolecular layer of organosilane compound by contacting the surface of the interlayer insulator with the organosilane compound,
contacting the monomolecular layer with an aqueous solution containing a palladium compound for modifying the monomolecular layer by a catalyst,
forming an electroless NiB plating layer by electroless NiB plating on the monomolecular layer which is modified by the catalyst,
forming an electroless CoWP plating layer by electroless CoWP plating on the electroless NiB plating layer, and
forming an electroless copper layer by electroless copper plating on the electroless CoWP plating layer.

10. The ULSI circuit wiring board of claim 7, wherein the silicon compound comprises at least one compound selected from the group consisting of silicon oxide ($SiO_2$), silicon oxide carbide (SiOC), silicon oxide fluoride (SiOF), silicon carbide (SiC) and hydrogen silsesquioxane (HSQ).

11. The ULSI circuit wiring board of claim 7, wherein the silicon compound has a dielectric constant k of two to four.

12. The ULSI circuit wiring board of claim 7, wherein the electroless NiB plating layer has a thickness of 0.5 to 10 nm.

13. The ULSI circuit wiring board of claim 7, wherein the electroless CoWP plating layer has a thickness of 1 to 50 nm.

* * * * *